United States Patent
Tseng

(10) Patent No.: US 8,106,396 B2
(45) Date of Patent: Jan. 31, 2012

(54) THIN FILM TRANSISTOR ARRAY SUBSTRATE

(75) Inventor: Sheng-Chia Tseng, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 139 days.

(21) Appl. No.: 12/419,306

(22) Filed: Apr. 7, 2009

(65) Prior Publication Data

US 2010/0084657 A1 Apr. 8, 2010

(30) Foreign Application Priority Data

Oct. 7, 2008 (TW) .............................. 97138561 A

(51) Int. Cl.
*H01L 23/58* (2006.01)
(52) U.S. Cl. ..................... 257/48; 257/E21.521; 349/42
(58) Field of Classification Search .................... 257/48, 257/E21.521, 359; 438/149; 349/42–43, 349/46

See application file for complete search history.

(56) References Cited

U.S. PATENT DOCUMENTS

| 6,762,805 | B2 | 7/2004 | Ishino | |
|---|---|---|---|---|
| 7,075,595 | B2* | 7/2006 | Moon | 349/46 |
| 2007/0182442 | A1* | 8/2007 | Hata et al. | 324/770 |
| 2007/0236243 | A1* | 10/2007 | Park et al. | 324/770 |

* cited by examiner

*Primary Examiner* — Ha Tran T Nguyen
*Assistant Examiner* — Shaun Campbell
(74) *Attorney, Agent, or Firm* — Jianq Chyun IP Office

(57) ABSTRACT

A thin film transistor array substrate includes a substrate having a display area and a peripheral area, a plurality of pixel units, a plurality of signal lines, and a testing circuit. The signal lines are electrically connected with the pixel units disposed in the display area. The testing circuit disposed in the peripheral area is electrically connected with terminals, located in the peripheral area, of a portion of the signal lines. The testing circuit includes a common gate line having a plurality of notches formed on an edge thereof, a plurality of channel layers, source electrodes, and drain electrodes. The source electrodes and the drain electrodes are disposed correspondingly on the channel layers disposed above the common gate line. Each drain electrode extends from the top of the common gate line to the top of one notch and extends to the terminal of one signal line for electrically connecting thereto.

14 Claims, 5 Drawing Sheets

THIN FILM TRANSISTOR ARRAY SUBSTRATE

CROSS-REFERENCE TO RELATED APPLICATION

This application claims the priority benefit of Taiwan application serial no. 97138561, filed on Oct. 7, 2008. The entirety of the above-mentioned patent application is hereby incorporated by reference herein and made a part of specification.

BACKGROUND OF THE INVENTION

1. Field of the Invention

The present invention relates to an array substrate and particularly to a thin film transistor array substrate.

2. Description of Related Art

Generally speaking, a liquid crystal display panel is mainly formed of a thin film transistor array substrate, a liquid crystal layer, and a color filter substrate. During the fabrication of a thin film transistor array substrate, a plurality of pixel arrays are usually simultaneously formed on a substrate, and testing circuits are timely and appropriately formed on the substrate to correspond to the pixel arrays, wherein the main function of the testing circuits is to apply a testing voltage to each pixel array, so as to detect whether the pixels in the pixel arrays function is well. After the test on the pixel arrays is completed, a laser cutting process is usually adopted to electrically separating the testing circuits from the pixel arrays, such that the pixel arrays may function properly.

To omit the aforesaid laser cutting process, the conventional technology usually adds a plurality of thin film transistors onto the testing circuits, so as to control the array test by turning on or turning off the thin film transistors. For instance, when a positive driving voltage is applied to the thin film transistors, the thin film transistors are turned on to perform the array test; and when a negative driving voltage is applied, the thin film transistors are turned off to break the testing circuits and allow the pixel arrays to function properly. After the array test is completed, the negative voltage is applied to keep the thin film transistors turned off. Hence, it is not required to perform the laser cutting process for electrically separating the testing circuits and the pixel arrays.

FIG. 1A illustrates a schematic view of a portion of a conventional thin film transistor array substrate, and FIG. 1B illustrates a schematic cross-sectional view of an area 101 in FIG. 1A. Referring to FIG. 1A first, a conventional thin film transistor array substrate 100 includes a display area 110 and a peripheral area 120, wherein a plurality of pixel units 130 are disposed on the display area 110, and a plurality of signal lines 132 disposed on the thin film transistor array substrate 100 are electrically connected with the pixel units 130. A plurality of thin film transistors 140 are disposed on the peripheral area 120, and the terminals 132a of the signal lines 132 are electrically connected to the thin film transistors 140. To be more detailed, the thin film transistor 140 includes a common gate line 142, a plurality of channel layers 144, a plurality of drain electrodes 146, and a plurality of source electrodes 148. The channel layers 144 are arranged above the common gate line 142. The drain electrodes 146 and the source electrodes 148 are respectively disposed on the corresponding channel layers 144, as shown in FIG. 1A. Specifically, the thin film transistors 140 are turned on or turned off mainly based on the voltages applied to the common gate line 142 and the source electrodes 148. For instance, when the thin film transistors 140 are turned on, the thin film transistor array substrate 100 is ready for performing the array test; and when the thin film transistors 140 are turned off, the active device (not shown) in the display area 110 of the thin film transistor array substrate 100 is allowed to perform ordinary display function. In other words, the conventional thin film transistor array substrate 100 mainly uses the thin film transistors 140 as a switch for controlling the array testing process. Hence, the laser cutting process is not required.

However, during the fabrication of the channel layers 144, static electricity is usually accumulated in the terminals 132a and the common gate line 142 to cause electrostatic discharge effects (ESD effects) which damage a dielectric layer 150 in the area 101 to form an opening 152, as indicated in FIG. 1B. After the drain electrodes 146 and the source electrodes 148 are formed, the common gate line 142 may be electrically connected with the drain electrodes 146 through the opening 152 caused by the electrostatic discharge effects between the terminals 132a and the common gate line 142, which results in line short and reduces the electrical quality and reliability of the fabrication. Generally speaking, a method for preventing the aforesaid electrostatic discharge effects is to increase the distance between the terminals 132a and the common gate line 142. However, such a method requires more space and inevitably reduces the utilization of the space in the substrate.

SUMMARY OF THE INVENTION

Accordingly, the present invention provides a thin film transistor array substrate for effectively preventing the decrease of process yield caused by electrostatic discharge effects.

The present invention provides a thin film transistor array substrate, including a substrate, a plurality of pixel units, a plurality of signal lines, and a testing circuit. The substrate has a display area and a peripheral area connected with the display area. The pixel units are disposed in the display area. The signal lines are electrically connected with the pixel units, and an end of each of the signal lines has a terminal located in the peripheral area. The testing circuit is disposed on the peripheral area and electrically connected with the terminals of a portion of the signal lines. The testing circuit includes a common gate line, a plurality of channel layers, a plurality of drain electrodes, and a plurality of source electrodes. A plurality of notches is formed on an edge of the common gate line, wherein the notches are corresponding to the pixel units. The channel layers are disposed above the common gate line. The drain electrodes are disposed on the corresponding channel layers. Each of the drain electrodes respectively extends from the top of the common gate line toward the top of one of the notches and further extends to the terminal of one of the signal lines so as to electrically connect thereto. The source electrodes are disposed on the corresponding channel layers.

According to an embodiment of the present invention, the common gate line and the terminals electrically connected with the testing circuit are the same layer.

According to an embodiment of the present invention, the testing circuit further includes a gate insulator layer. The gate insulator layer is disposed on the substrate for covering the common gate line and a portion of the signal lines connected with the testing circuit.

According to an embodiment of the present invention, an extending direction of a portion of the signal lines connected with the testing circuit is substantially perpendicular to an extending direction of the common gate line.

According to an embodiment of the present invention, a line width of each drain electrode is smaller than a width of each notch.

According to an embodiment of the present invention, at least one of the drain electrodes has a turning portion arranged above one of the notches.

According to an embodiment of the present invention, the signal lines include a plurality of data lines and a plurality of scan lines.

According to an embodiment of the present invention, the signal lines include a plurality of common lines.

According to an embodiment of the present invention, the scan lines or the data lines are electrically connected with the drain electrodes.

According to an embodiment of the present invention, the thin film transistor array substrate further includes a plurality of connection lines electrically connected with the common lines, wherein the connection lines intersect the common gate line, and each of the connection lines respectively passes over one of the notches.

According to an embodiment of the present invention, the thin film transistor array substrate further includes a peripheral circuit. The peripheral circuit is disposed on the peripheral area.

According to an embodiment of the present invention, the peripheral circuit defines a gate driver bonding area in the peripheral area, and the gate driver bonding area and the testing circuit are respectively disposed on two opposite sides of the pixel units.

According to an embodiment of the present invention, the peripheral circuit defines a gate driver bonding area in the peripheral area, and the testing circuit is located in the gate driver bonding area.

According to an embodiment of the present invention, the notches are formed on an edge closer to the pixel units.

According to an embodiment of the present invention, the common gate line has a plurality of notches formed on an edge thereof, and the notches are arranged on an edge closer to the pixel units. Moreover, the drain electrodes and the connection lines respectively extend from the top of the common gate line toward the top of the notches and further extend to the terminals of the signal lines so as to electrically connect thereto. Thereby, the process yield of the thin film transistor array substrate is improved, and the thin film transistor array substrate can have better electrical property.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 2A:
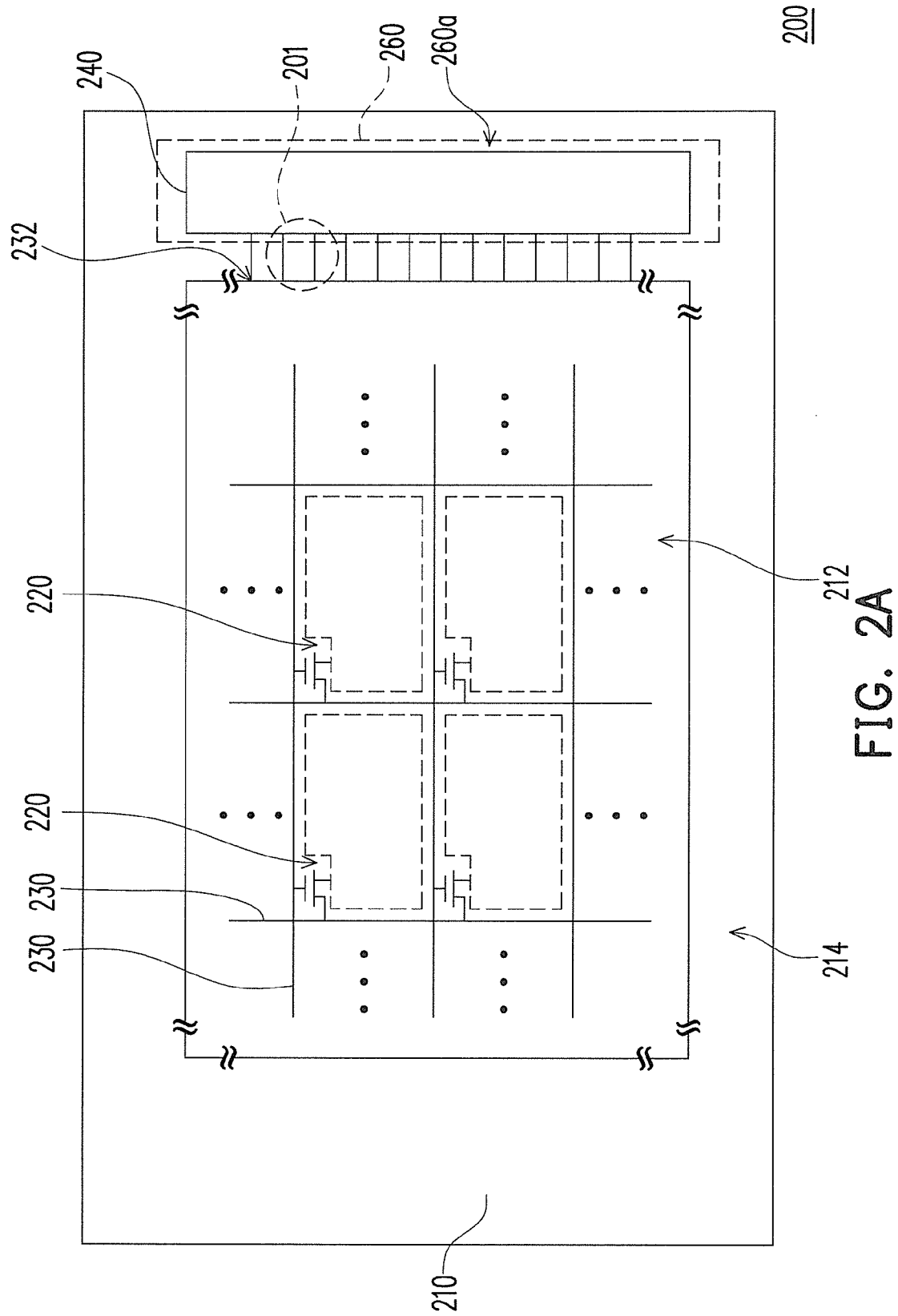
FIG. 2A illustrates a block diagram of a circuit of a thin film transistor array substrate according to one embodiment of the present invention.
Figure 2B:
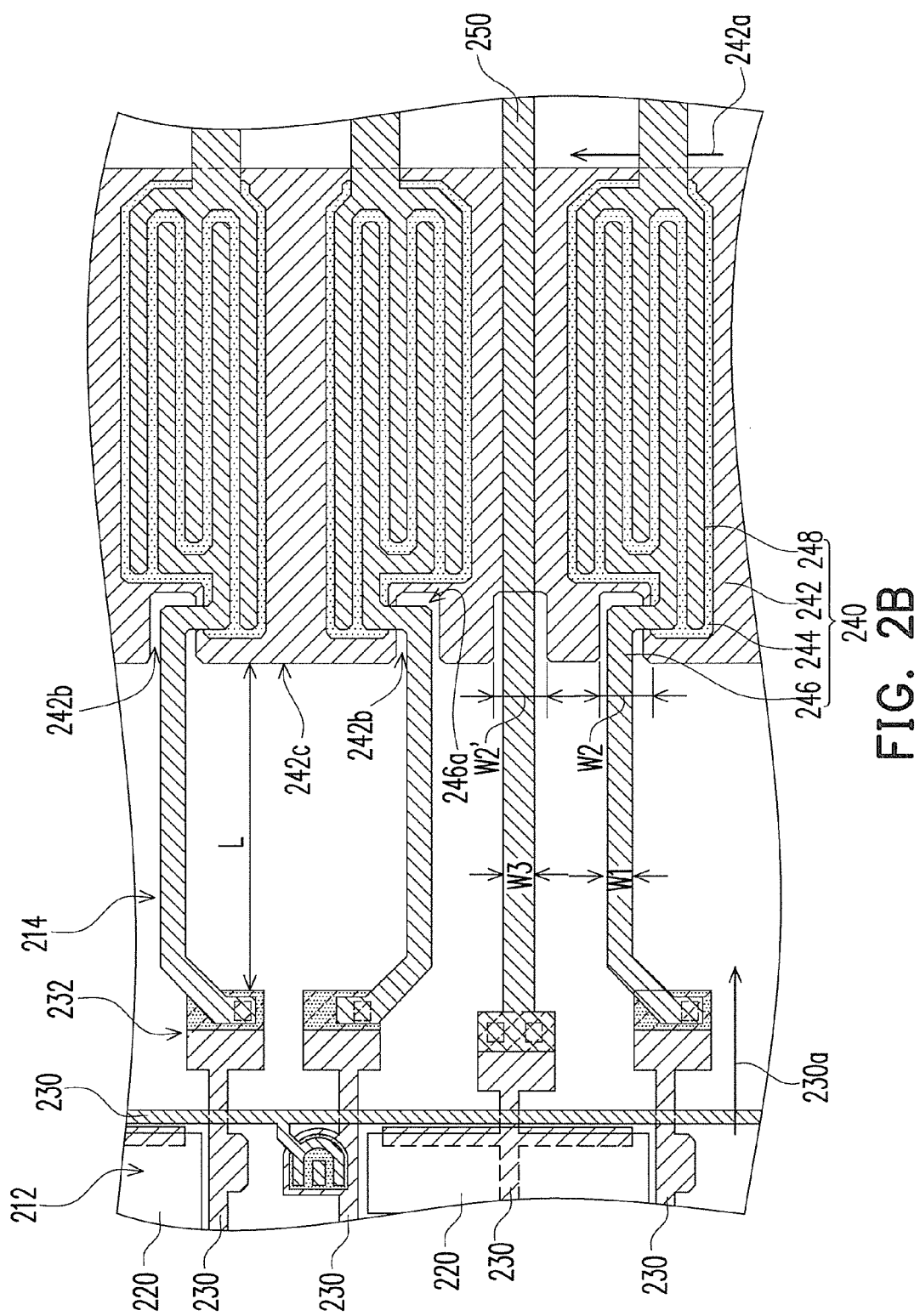
FIG. 2B illustrates a partially-enlarged view of an area 201 of the thin film transistor array substrate in FIG. 2A.

FIG. 2A is a block diagram illustrating a circuit of a thin film transistor array substrate according to one embodiment of the present invention, and FIG. 2B illustrates a partially-enlarged view of an area 201 of the thin film transistor array substrate in FIG. 2A. Referring to FIG. 2A and FIG. 2B, a thin film transistor array substrate 200 of this embodiment comprises a substrate 210, a plurality of pixel units 220, a plurality of signal lines 230, and a testing circuit 240. The substrate 210 has a display area 212 and a peripheral area 214 connected with the display area 212. In this embodiment, a material of the substrate 210 may be an inorganic transparent material, an organic transparent material, or an inorganic opaque material, or be flexible or inflexible, or have a plane surface or a curved surface. For instance, the substrate 210 is used as a base in a pixel array substrate. Glass, one of the inorganic transparent materials, is taken as an example in the embodiment, but the present invention is not limited thereto.

The pixel units 220 are disposed in the display area 212, and the signal lines 230 are electrically connected with the pixel units 220. In addition, an end of each signal line 230 has a terminal 232 located in the peripheral area 214, as shown in FIG. 2A or FIG. 2B. In this embodiment, the signal lines 230 are, for example, a plurality of data lines, a plurality of scan lines, and a plurality of common lines.

The testing circuit 240 is disposed on the peripheral area 214 and electrically connected with the terminals 232 of a portion of the signal lines 230, as shown in FIG. 2A or FIG. 2B. In this embodiment, an extending direction 230a of a portion of the signal lines 230 connected with the testing circuit 240 is substantially perpendicular to an extending direction 242a of a common gate line 242, as shown in FIG. 2B. In other embodiments, an included angle between the extending direction 230a and the extending direction 242a may also be other angles. The above is merely one of the examples, and the present invention is not limited thereto.

The testing circuit 240 includes the common gate line 242, a plurality of channel layers 244, a plurality of drain electrodes 246, and a plurality of source electrodes 248. A plurality of notches 242b are formed on an edge 242c of the common gate line 242, wherein the notches 242b are corresponding to the pixel units 220, as shown in FIG. 2B. In this embodiment, the notches 242b are arranged on the edge 242c closer to the pixel units 220. In a general fabricating process, the common gate line 242 and the terminals 232 electrically connected with the testing circuit 240 are formed of the same layer.

Moreover, the channel layers 244 are disposed on the common gate line 242, and the drain electrodes 246 are disposed on the corresponding channel layers 244. To be more specific, each of the drain electrodes 246 extends from the top of the common gate line 242 to the top of one of the notches 242b, and further extends to the terminal 232 of one of the signal lines 230 so as to electrically connect thereto, as shown in FIG. 2B. In this embodiment, at least one of the drain electrodes 246 has a turning portion 246a. The turning portion 246a is disposed above one of the notches 242b. Furthermore, a line width W1 of each drain electrode 246 is smaller than a width W2 of each notch 242b, as shown in FIG. 2B. In addition, the source electrodes 248 and the drain electrodes 246 are respectively disposed on the corresponding channel layers 244, wherein a portion of the signal lines 230 (a plurality of scan lines or data lines, for example) are electrically connected with the drain electrodes 246 of the testing circuit 240.

In this embodiment, the testing circuit 240 further includes a gate insulator layer (not shown) disposed on the substrate 210 for covering the common gate line 242 and a portion of the signal lines 230 connected with the testing circuit 240. Specifically, the common gate line 242, the channel layers 244, the drain electrodes 246, the source electrodes 248, and the gate insulator layer as illustrated in FIG. 2B may be deemed as a plurality of thin film transistors (not shown), and these thin film transistors are turned on or turned off based on the voltages respectively received by the common gate line 242 and the source electrodes 248. In this embodiment, these thin film transistors are turned on or turned off to determine whether an array test is performed or not. Moreover, the thin film transistors formed of the common gate line 242, the channel layers 244, the drain electrodes 246, the source electrodes 248, and the gate insulator layer in this embodiment are comb-shaped thin film transistors, as shown in FIG. 2B. However, the drain electrodes 246 and the source electrodes 248 may be designed as circular thin film transistors or other types of thin film transistors according to the user's requirements. In addition, the thin film transistors may be top-gate thin film transistors or bottom-gate thin film transistors, based on the design of the common gate line 242. That is, FIG. 2B merely illustrates one of the examples, and the present invention is not limited thereto.

Figure 1A:
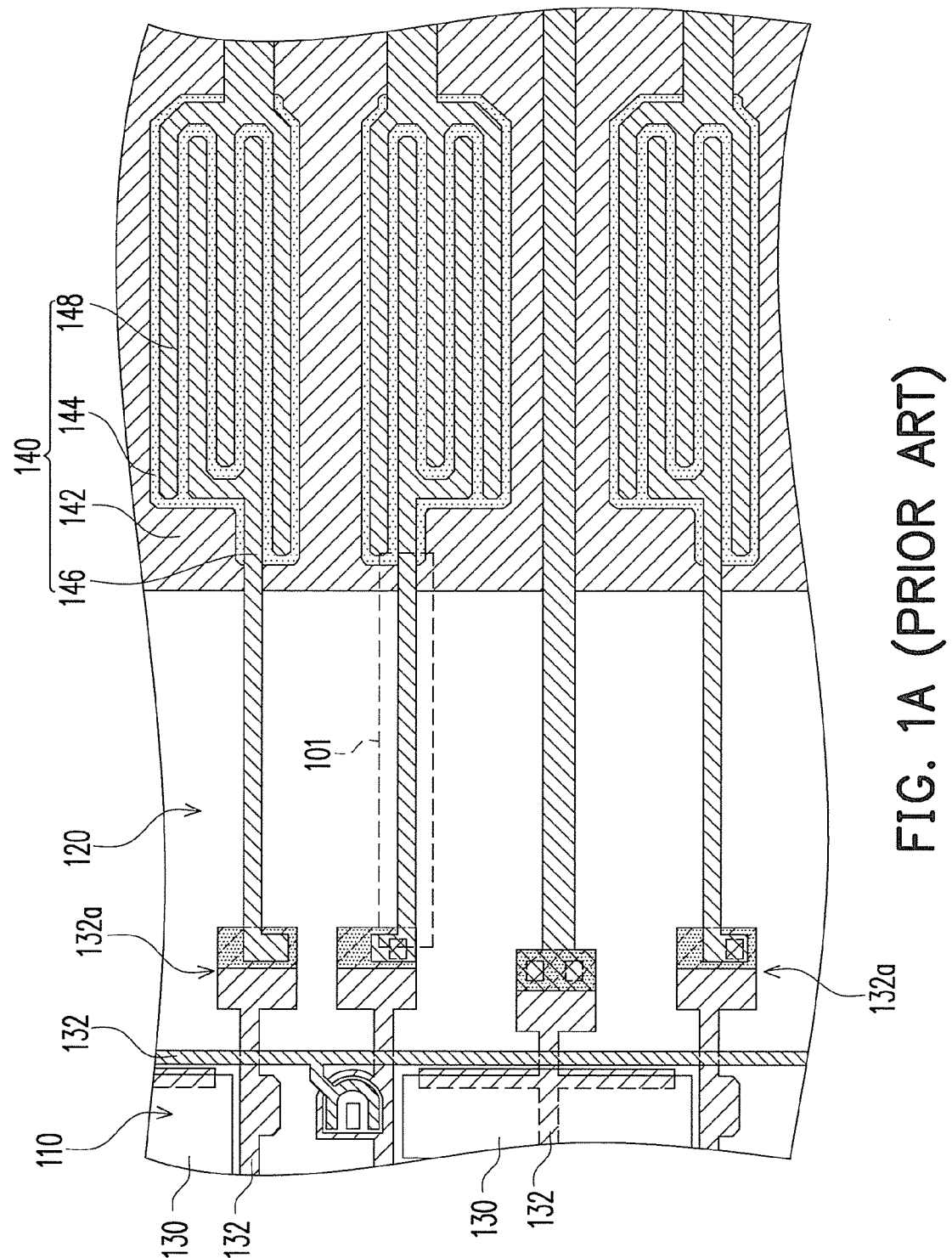
FIG. 1A illustrates a schematic view of a portion of a conventional thin film transistor array substrate.
Figure 1B:
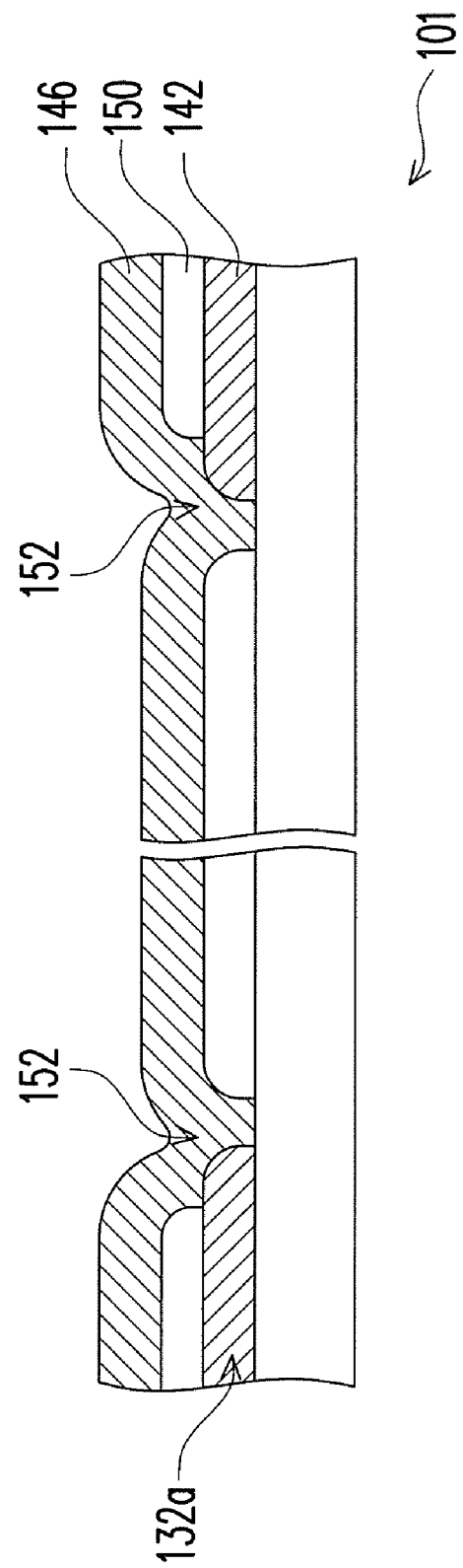
FIG. 1B illustrates a schematic cross-sectional view of an area 101 in FIG. 1A.

Generally speaking, a great deal of static electricity would be accumulated during the process of forming the channel layers 244, such as a spin-coating process. If the static electricity is not effectively released, electrostatic discharge effects may occur. In other words, when the static electricity accumulated at the terminals 232 of the signal lines 230 and the common gate line 242 reaches a certain quantum, the static electricity may cause electrostatic discharge effects based on a shortest distance L there between, which brings damage to the gate insulator layer and forms the openings 152 as shown in FIG. 1B. Inevitably, the common gate line 242 is electrically connected with the terminals 232 of the signal lines 230 by the films of the drain electrodes 246 when the array test is performed after the drain electrodes 246 and the source electrodes 248 are formed. Short circuit therefore occurs.

Accordingly, the transistor array substrate 200 of this embodiment has a plurality of notches 242b formed on the edge 242c of the common gate line 242. In addition, each drain electrode 246 extends from the top of the common gate line 242 toward the top of one of the notches 242b and further extends to the top of the terminal 232 of one of the signal lines 230, so as to electrically connect thereto. With the aforesaid design, although the electrostatic discharge accumulation may still occur at the terminals 232 and the common gate line 242 during the fabricating process, the distance between the notches 242b and the terminals 232 is not the shortest distance L. Hence, the film of the common gate line 242 in the notches 242b would not be influenced and damaged by the electrostatic discharge effects easily. Consequently, when the drain electrodes 246 extend to the terminals 232 of the signal lines 230 through the notches 242b and electrically connect with the terminals 232, the common gate line 242 would not be electrically connected with the drain electrodes 246 through the openings to connect the terminals 232, and thus short circuit can be prevented.

In addition, the thin film transistor array substrate 200 further includes a plurality of connection lines 250 electrically connected with the common lines, wherein the connection lines 250 intersect the common gate line 242, and each of the connection lines 250 respectively passes above one of the notches 242b. In this embodiment, a line width W3 of each connection line 250 is smaller than a line width W2' of each notch 242b, as shown in FIG. 2B. Further, the line widths W2 and W2' may be designed to be equal or different according to the user's requirements. To be more specific, if the connection lines 250 do not pass over the notches 242b, the common gate line 242 under the connection lines 250 may be electrically connected with the connection lines 250 through the defects caused by the electrostatic discharge effects and result in short circuit. The design of the connection lines 250 in this embodiment has been described as above. By disposing each connection line 250 above one of the notches 242b to electrically connect to the common lines (the aforesaid signal lines, for example), the problem of short circuit caused by the electrostatic discharge effects may be overcome.

Figure 3:
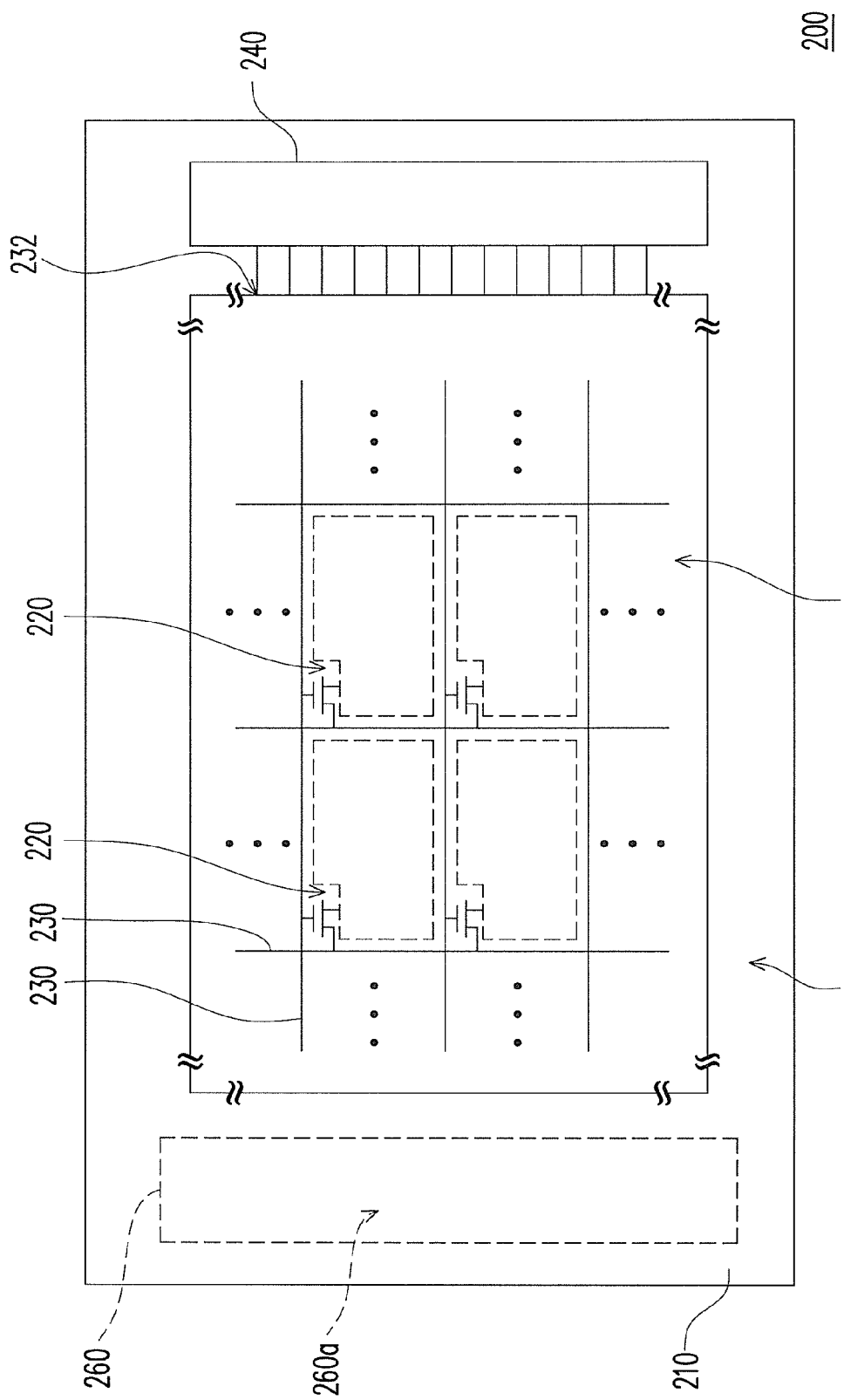
FIG. 3 illustrates a block diagram of a circuit of a thin film transistor array substrate according to another embodiment of the present invention.

Moreover, the thin film transistor array substrate 200 further includes a peripheral circuit 260. The peripheral circuit 260 is disposed on the peripheral area 214. In this embodiment, the peripheral circuit 260 may define a gate driver bonding area 260a in the peripheral area 214, and the testing circuit 240 is located in the gate driver bonding area 260a, as shown in FIG. 2A. To be more specific, the peripheral circuit 260 includes traces, ESD protection circuits, or other circuits in addition to the testing circuit 240. Furthermore, a plurality of gate driving chips (not shown) may be directly disposed in the gate driver bonding area 260a by performing a chip-on-glass (COG) process, and the gate driving chips are mainly used for controlling the voltage signals of the gates (not shown) inside the common gate line 242 and the pixel units 220. In another embodiment, the gate driver bonding area 260a and the testing circuit 240 may be disposed on two opposite sides of the display area 212, as shown in FIG. 3. The descriptions thereof may be referred to in the above paragraphs.

According to this embodiment, the thin film transistor array substrate 200 may be applied to a transmissive display panel, a transflective display panel, a reflective display panel, a color-filter-on-array display panel, an array-on-color-filter display panel, a VA display panel, an IPS display panel, an MVA display panel, a TN display panel, an STN display panel, a PVA display panel, an S-PVA display panel, an ASV display panel, an FFS display panel, a CPA display panel, an ASM display panel, an OCB display panel, an S-IPS display panel, an AS-IPS display panel, an UFFS display panel, a PSA display panel, a dual-view display panel, a triple-view display panel, a three-dimensional display panel, or other types of display panels.

It is noted that the aforementioned layout of the drain electrodes 246 and the source electrodes 248 is merely one of the examples, and the present invention is not limited thereto. The positions of the drain electrodes 246 and the source electrodes 248 may also be exchanged to meet the user's requirements and design.

To conclude, the thin film transistor array substrate of the present invention has at least the following advantages: First, a plurality of notches are formed on an edge of the common gate line. Further, the drain electrodes and the connection lines disposed above the common gate line respectively extend from the top of the common gate line toward the top of the notches and further extend to the terminals of the signal lines so as to electrically connect thereto. Therefore, the electrical connection formed by the electrostatic discharge effects between the common gate line and the drain electrodes and the connection lines is prevented, and circuit defects or short circuit are avoided. Additionally, if the testing circuit is arranged in the gate driver bonding area, the use of the space in the substrate is effectively reduced and the utilization of the substrate is raised. In a word, the thin film transistor array substrate of the present invention effectively reduces the circuit defects caused by the electrostatic discharge effects when performing array test or being driven, and thus provides better electrical quality and process reliability.

Although the present invention has been disclosed by the above preferable embodiments, they are not intended to limit the present invention. Anybody skilled in the art can make some modifications and variations without departing from the spirit and scope of the present invention. Therefore, the protecting range of the present invention falls in the appended claims.

What is claimed is:

1. A thin film transistor array substrate, comprising:
   a substrate having a display area and a peripheral area connected with the display area;
   a plurality of pixel units disposed in the display area;
   a plurality of signal lines electrically connected with the pixel units, and an end of each of the signal lines having a terminal located in the peripheral area; and
   a testing circuit disposed on the peripheral area and electrically connected with the terminals of a portion of the signal lines, and the testing circuit comprising:
      a common gate line having a plurality of notches formed on an edge thereof;
      a plurality of channel layers disposed above the common gate line;
      a plurality of drain electrodes disposed on the corresponding channel layers, wherein each of the drain electrodes respectively extends from the top of the common gate line toward the top of one of the notches and further extends along an extension direction to the top of the terminal of one of the signal lines so as to electrically connect thereto, and two extension lines extending from two opposite sides of the terminals that are parallel to the extension direction define a range and a portion of each of the drain electrodes extending along the extension direction is configured outside the range; and
      a plurality of source electrodes disposed on the corresponding channel layers.

2. The thin film transistor array substrate as claimed in claim 1, wherein the common gate line and the terminals electrically connected with the testing circuit are the same layer.

3. The thin film transistor array substrate as claimed in claim 2, wherein the testing circuit further comprises a gate insulator layer disposed on the substrate for covering the common gate line and a portion of the signal lines connected with the testing circuit.

4. The thin film transistor array substrate as claimed in claim 1, wherein an extending direction of a portion of the signal lines connected with the testing circuit is substantially perpendicular to an extending direction of the common gate line.

5. The thin film transistor array substrate as claimed in claim 1, wherein a line width of each of the drain electrodes is smaller than a width of each of the notches.

6. The thin film transistor array substrate as claimed in claim 1, wherein at least one of the drain electrodes comprises a turning portion arranged above one of the notches.

7. The thin film transistor array substrate as claimed in claim 1, wherein the signal lines comprise a plurality of data lines and a plurality of scan lines.

8. The thin film transistor array substrate as claimed in claim 1, wherein the signal lines comprise a plurality of common lines.

9. The thin film transistor array substrate as claimed in claim 7, wherein the scan lines or the data lines are electrically connected with the drain electrodes.

10. The thin film transistor array substrate as claimed in claim 8, further comprising a plurality of connection lines electrically connected with the common lines, wherein the connection lines intersect the common gate line, and each of the connection lines respectively passes over one of the notches.

11. The thin film transistor array substrate as claimed in claim 1, further comprising a peripheral circuit disposed on the peripheral area.

12. The thin film transistor array substrate as claimed in claim 11, wherein the peripheral circuit defines a gate driver bonding area in the peripheral area, and the gate driver bonding area and the testing circuit are respectively disposed on two opposite sides of the display area.

13. The thin film transistor array substrate as claimed in claim 11, wherein the peripheral circuit defines a gate driver bonding area in the peripheral area, and the testing circuit is disposed in the gate driver bonding area.

14. The thin film transistor array substrate as claimed in claim 1, wherein the notches are arranged on the edge closer to the pixel units.

* * * * *